United States Patent
Jang et al.

(10) Patent No.: US 12,557,587 B2
(45) Date of Patent: Feb. 17, 2026

(54) APPARATUS AND METHOD MONITORING SEMICONDUCTOR MANUFACTURING EQUIPMENT

(71) Applicant: SAMSUNG ELECTRONICS CO., LTD., Suwon-si (KR)

(72) Inventors: Sungho Jang, Suwon-si (KR); Hyungjin Kim, Suwon-si (KR); Minhwan Seo, Suwon-si (KR); Akinori Okubo, Suwon-si (KR); Sangmin Lee, Suwon-si (KR); Sinyong Lee, Suwon-si (KR); Wondon Joo, Suwon-si (KR); Sangjoon Hong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 263 days.

(21) Appl. No.: 18/125,853

(22) Filed: Mar. 24, 2023

(65) Prior Publication Data
US 2024/0128102 A1  Apr. 18, 2024

(30) Foreign Application Priority Data
Oct. 12, 2022 (KR) .................. 10-2022-0130599

(51) Int. Cl.
*H01L 21/67* (2006.01)
*G01B 11/06* (2006.01)

(52) U.S. Cl.
CPC .... *H01L 21/67259* (2013.01); *G01B 11/0608* (2013.01)

(58) Field of Classification Search
CPC .......... H01L 21/67259; G01B 11/0608; G01B 11/022; G01B 11/2513; G01B 11/254
See application file for complete search history.

(56) References Cited

U.S. PATENT DOCUMENTS

| 7,247,843 | B1 | 7/2007 | Moon |
| RE42,184 | E * | 3/2011 | Bass .................. C09K 11/7773 365/151 |
| 9,846,373 | B2 | 12/2017 | Li et al. |
| 9,977,343 | B2 | 5/2018 | Goodwin et al. |

(Continued)

FOREIGN PATENT DOCUMENTS

| KR | 0269267 B1 | 7/2000 |
| KR | 20120000236 A | 1/2012 |

*Primary Examiner* — Thanh Luu
*Assistant Examiner* — Mai Thi Ngoc Tran
(74) *Attorney, Agent, or Firm* — Fish & Richardson P.C.

(57) ABSTRACT

An apparatus monitoring semiconductor manufacturing equipment includes an optical detector, a light generator generating light along an optical path towards a semiconductor substrate, a first grating reticle between the light generator and the semiconductor substrate and including first slits having a first pitch and second slits having a second pitch different from the first pitch, a second grating reticle between the semiconductor substrate and the optical detector and including third slits having a third pitch different from the first pitch and the second pitch, in which the optical detector determines a positional attribute of the semiconductor substrate in relation to a first pattern and a second pattern, the first pattern corresponds to a first portion of light sequentially passing through the first slits and the third slits, and the second pattern corresponds to a second portion of light sequentially passing through the second slits and the third slits.

18 Claims, 8 Drawing Sheets

(56) References Cited

U.S. PATENT DOCUMENTS

| | | |
|---|---|---|
| 10,025,205 B2 | 7/2018 | Zhu et al. |
| 2021/0200106 A1 | 7/2021 | Levinski et al. |
| 2021/0254964 A1* | 8/2021 | Taniguchi ............... H01J 37/20 |

* cited by examiner

APPARATUS AND METHOD MONITORING SEMICONDUCTOR MANUFACTURING EQUIPMENT

CROSS REFERENCE TO RELATED APPLICATION

This U.S. non-provisional patent application claims priority under 35 U.S.C. § 119 to Korean Patent Application No. 10-2022-0130599 filed on Oct. 12, 2022 in the Korean Intellectual Property Office, the subject matter of which is hereby incorporated by reference in its entirety.

BACKGROUND

1. Field

Embodiments of the inventive concept relate to apparatuses and methods for monitoring semiconductor manufacturing equipment. More particularly, embodiments of the inventive concept relate to apparatuses and methods that monitor semiconductor manufacturing equipment by measuring a positional attribute of a semiconductor substrate using light.

2. Description of the Related Art

During a semiconductor photolithography process, the positioning of a semiconductor substrate being processed must be well controlled. That is, accurate exposure of the semiconductor substrate to irradiating light associated with the photolithography process is highly dependent upon correct positioning of the semiconductor substrate.

SUMMARY

Some embodiments of the inventive concept provide apparatuses capable of monitoring semiconductor manufacturing equipment using light passing through at least one grating reticle that enlarges a detectable area through slits having different pitches. Other embodiments of the inventive concept provide a method of monitoring semiconductor manufacturing equipment using this type of monitoring apparatus.

According to certain embodiments, an apparatus monitoring semiconductor manufacturing equipment may include; an optical detector, a light generator configured to generate light along a first optical path towards a semiconductor substrate disposed on a substrate stage in a processing chamber, wherein upon irradiating the semiconductor substrate, the light becomes reflected light along a second optical path away from the semiconductor substrate and towards the optical detector, a first grating reticle disposed between the light generator and the semiconductor substrate, wherein the first grating reticle includes first slits having a first pitch and second slits having a second pitch different from the first pitch, a second grating reticle disposed between the semiconductor substrate and the optical detector, wherein the second grating reticle includes third slits having a third pitch different from the first pitch and the second pitch, wherein the optical detector is configured to determine a positional attribute of the semiconductor substrate in relation to a first pattern and a second pattern, the first pattern corresponds to a first portion of light/reflected light sequentially passing through the first slits and the third slits, and the second pattern corresponds to a second portion of light/reflected light sequentially passing through the second slits and the third slits.

According to certain embodiments, an apparatus monitoring semiconductor manufacturing equipment may include; an optical detector, a light generator configured to generate light along a first optical path towards a semiconductor substrate disposed on a substrate stage in a processing chamber, wherein upon irradiating the semiconductor substrate, the light becomes reflected light along a second optical path away from the semiconductor substrate and towards the optical detector, a first grating reticle disposed between the light generator and the semiconductor substrate, wherein the first grating reticle includes first slits having a first pitch and second slits having a second pitch different from the first pitch, a second grating reticle disposed between the semiconductor substrate and the optical detector, wherein the second grating reticle includes third slits having a third pitch different from the first pitch and the second pitch, wherein the optical detector is configured to determine a height of the semiconductor substrate in relation to a first pattern and a second pattern using a triangulation approach, the first pattern corresponds to a first portion of light/reflected light sequentially passing through the first slits and the third slits, and the second pattern corresponds to a second portion of light/reflected light sequentially passing through the second slits and the third slits.

According to certain embodiments, an apparatus monitoring semiconductor manufacturing equipment may include; a light generator generating light having a predetermined wavelength along a first optical path between the light generator and the semiconductor substrate, a first optical lens directing the light along the first optical path, a first grating reticle disposed along the first optical path, including first slits having a first pitch and second slits having a second pitch different from the first pitch, and selectively passing the light to generate first refracted light, a second optical lens focusing the first refracted light onto the semiconductor substrate, wherein upon irradiating the semiconductor substrate the first refracted light becomes reflected light along a second optical path different from the first optical path, a third optical lens directing the reflected light along the second optical path, a second grating reticle disposed along the second optical path, including third slits having a third pitch different from the first pitch and the second pitch, and selectively passing the reflected light to generate second refracted light, and an optical detector configured to determine a height associated with the semiconductor substrate using a triangulation approach in relation to a first pattern and a second pattern, wherein the first pattern corresponds to a first portion of light/reflected light sequentially passing through the first slits and the third slits, and the second pattern corresponds to a second portion of light/reflected light sequentially passing through the second slits and the third slits.

BRIEF DESCRIPTION OF THE DRAWINGS

Advantages, benefits and features, as well as the making and use of the inventive concept may be clearly understood upon consideration of the following detailed description together with the accompanying drawings, in which.

DETAILED DESCRIPTION

Throughout the written description and drawings, like reference numbers and labels denote like or similar elements, components, features, and/or method steps. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

In order to properly control the processing of a semiconductor substrate, the positioning (e.g., dispositional height) of the semiconductor substrate must be accurately measured and carefully controlled. That is, the proper use of semiconductor manufacturing equipment within a processing chamber requires an accurate measurement of a separating distance between the semiconductor substrate and the equipment. In this regard, the range of a detection area associated with measuring the separation distance should greater than a step range for features of the semiconductor structure. Further in this regard, as one example, the relative height of the semiconductor substrate in the processing chamber may be controlled by accurate positional measurements in relation to a position detection area wider than that of a positional deviation of the semiconductor substrate. In order to measure a positional attribute (e.g., height) associated with the semiconductor substrate, the measurement apparatus and method may make use of the Moire phenomenon.

Figure 1:
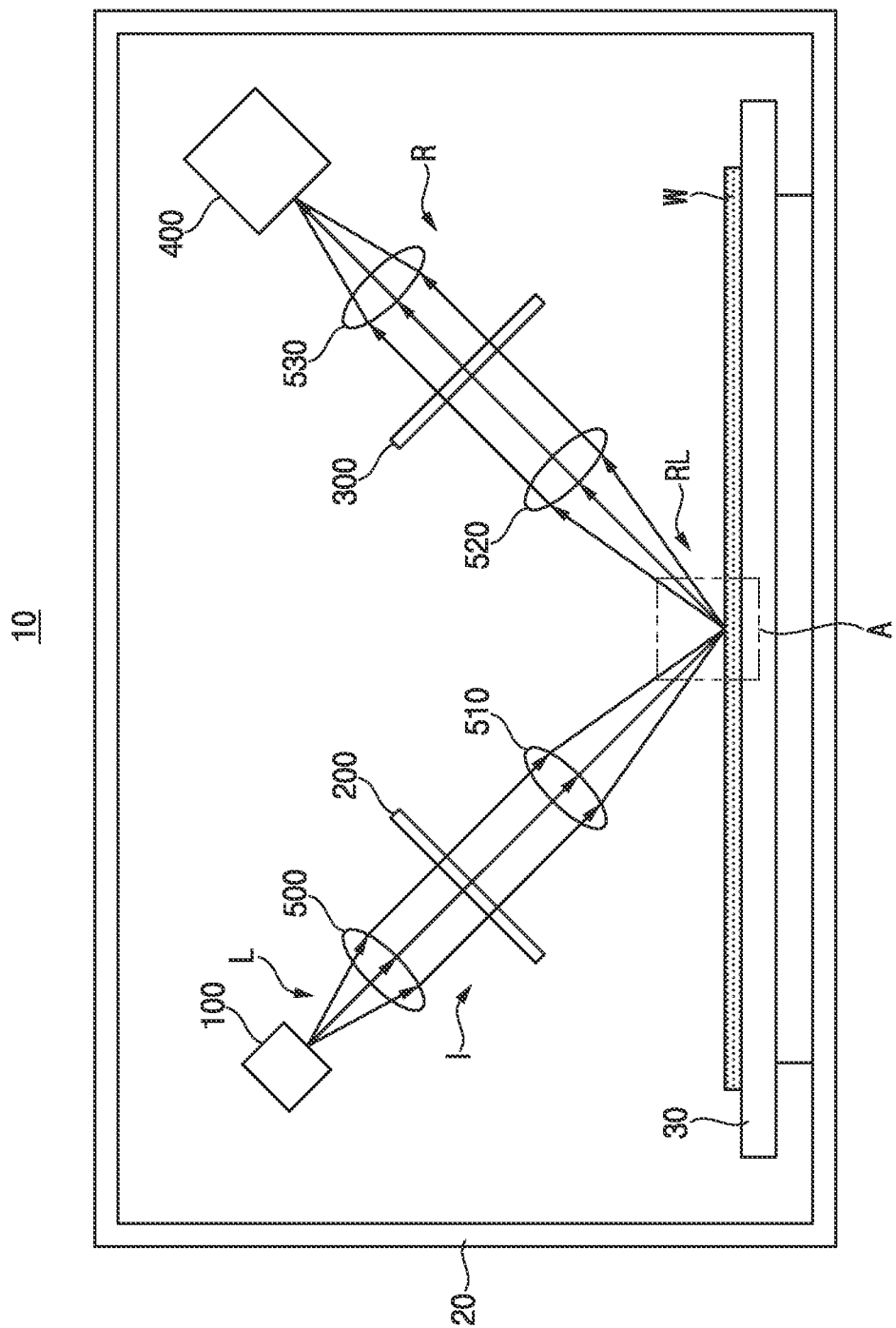
FIG. 1 is a conceptual diagram illustrating an apparatus 10 for monitoring semiconductor manufacturing equipment according to embodiments of the inventive concept.
Figure 2:
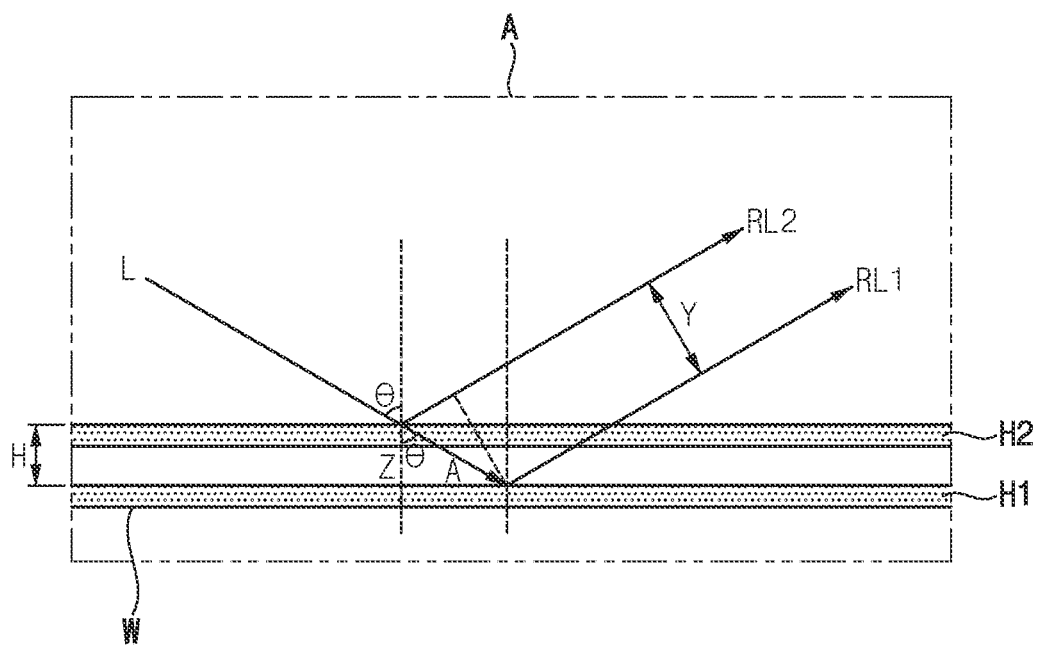
FIG. 2 is an enlarged view further illustrating the region 'A' indicated in FIG. 1.
Figure 3A:
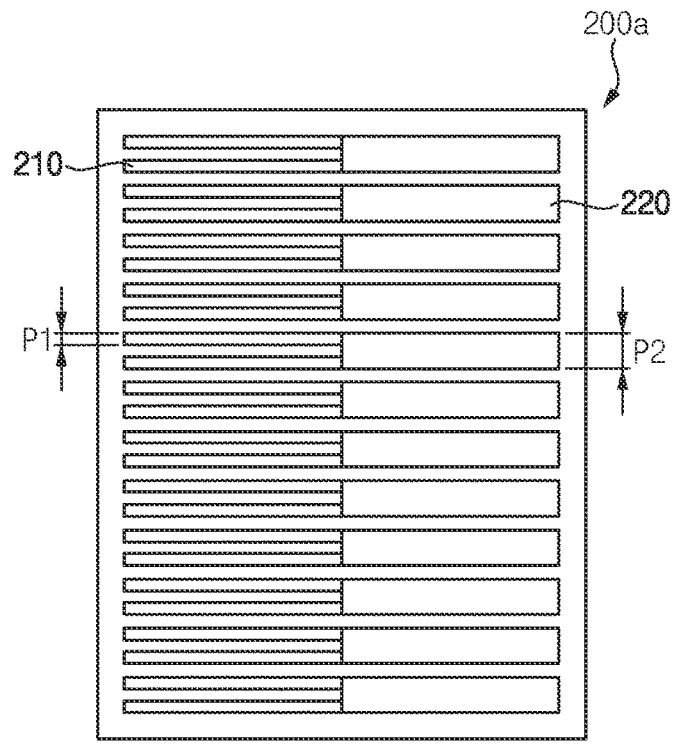
FIGS. 3A, 3B and 3C are respective plan views further illustrating in several examples the first grating reticle 200 of FIG. 1.
Figure 3B:
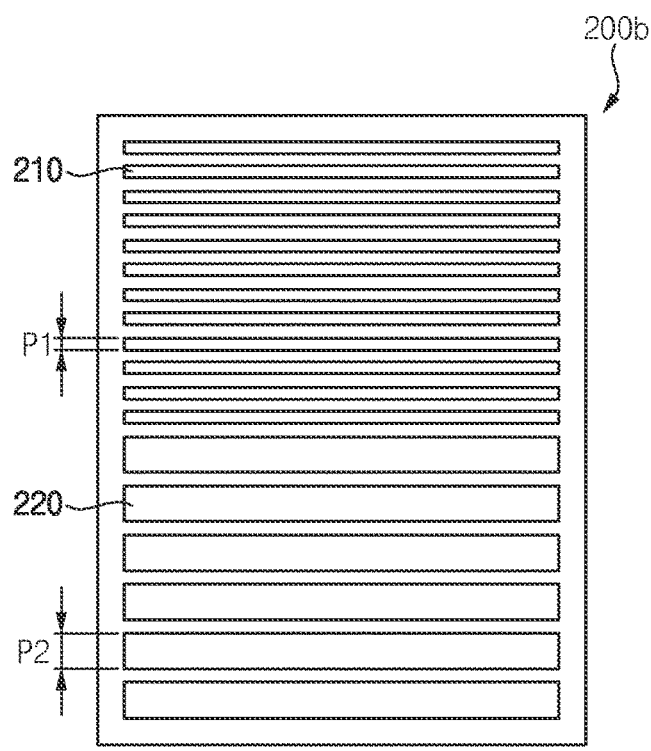
Figure 3C:
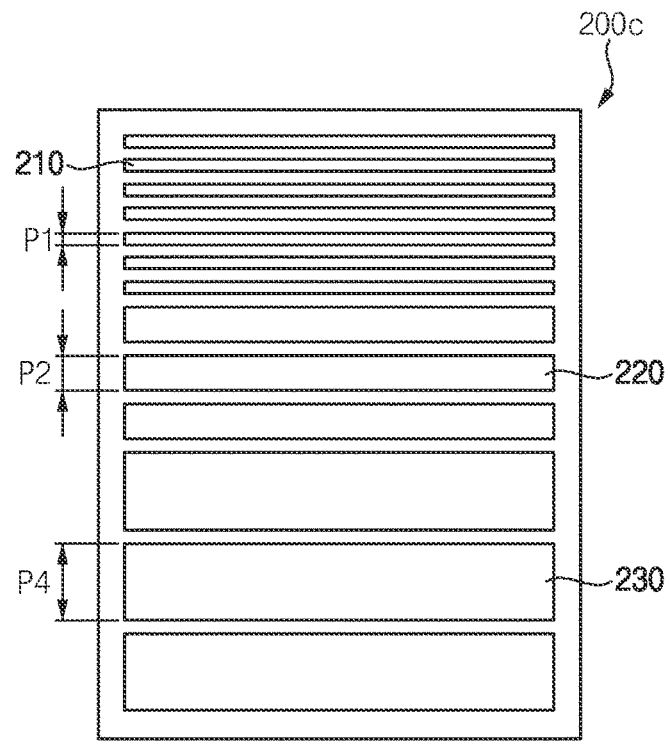
Figure 4:
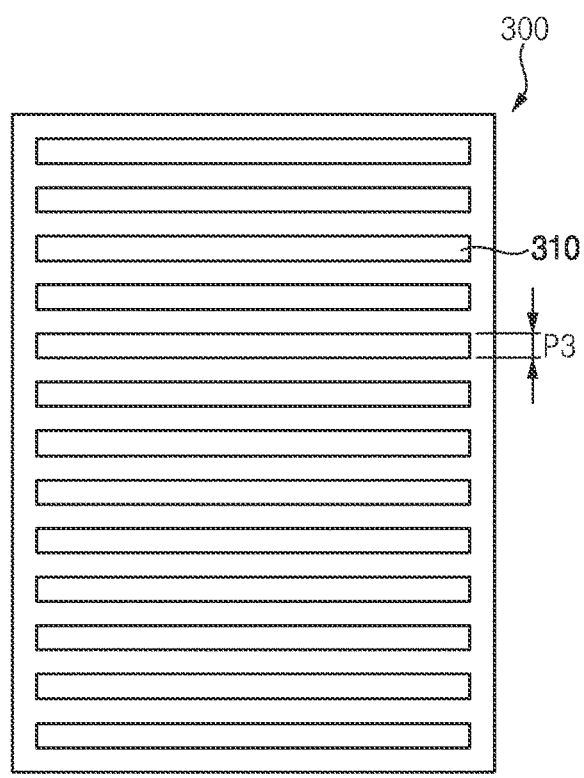
FIG. 4 is a plan view further illustrating in one example the second grating reticle 300 of FIG. 1.

Figure (FIG. 1 is a conceptual diagram illustrating an apparatus for monitoring semiconductor manufacturing equipment according to embodiments of the inventive concept. FIG. 2 is an enlarged view further illustrating the region 'A' indicated in FIG. 1; FIGS. 3A, 3B and 3C are respective plan (or top-down) diagrams illustrating the first grating reticle of FIG. 1; and FIG. 4 is a plan diagram illustrating the second grating reticle of FIG. 1.

Referring collectively to FIGS. 1, 2, 3A, 3B, 3C and 4, the apparatus 10 for monitoring semiconductor manufacturing equipment may generally include an illumination portion I (e.g., an illumination optical system) and a receiving portion R (e.g., a light receiving optical system).

The illumination portion I may include at least a light generator 100 and a first grating reticle 200.

The light generator 100 may be used to generate electromagnetic energy of predetermined wavelength (hereafter simply, "light" L) along a first optical path towards a semiconductor substrate W mounted on a substrate stage 30 in a processing chamber 20. Here, the semiconductor substrate W may include a semiconductor wafer, a glass substrate, etc.

In some embodiments, the light L may pass through and be directed by a first optical lens 500 (e.g., one or more optical lenses including a collimator lens) configured to control (or define) the first optical path between the light generator 100 and the semiconductor substrate W. Hence, as controlled by the light generator 100 and the first optical lens 500, the light L may pass through the first grating reticle 200. In some embodiments, after passing through the first grating reticle 200, the light L may also pass through and be directed by a second optical lens 510 (e.g., one or more optical lenses including a focusing lens) additionally controlling the first optical path.

The receiving portion R may include at least a second grating reticle 300 and an optical detector 400 (e.g., a line camera).

Upon illuminating (or impacting) the semiconductor substrate W, the light L becomes reflected light RL along a second optical path away from the semiconductor substrate W and towards the optical detector 400. (In this context, the term "becomes" denotes change in at least one property (e.g., direction) between light generated by the light generator 100 and directed towards the semiconductor substrate W and reflected light reflected from the semiconductor substrate W towards the optical detector 400). The reflected light RL passes through a second grating reticle 300 disposed long the second optical path between the semiconductor substrate W and the optical detector 400.

In some embodiments, the reflected light RL may pass through a third optical lens 520 (e.g., one or more optical lenses including a collimator lens) before passing through the second grating reticle 300. And after passing through the second grating reticle 300, the reflected light RL may pass through a fourth optical lens 530 (e.g., one or more optical lenses including a focusing lens). That is, in some embodiments, the third and fourth optical lens 520 and 530 may be used to control the second optical path, and as controlled by the third and fourth optical lens 520 and 530, the reflected light may be captured (e.g., imaged or received) by the optical detector 400.

Of note, the use of first, second, third and/or fourth optical lens 510, 520, 530, 540 to control (or define) the first optical path and/or second optical path is deemed to be a matter of design choice within various embodiments of the inventive concept.

With the foregoing configuration the apparatus 10 of FIG. 1 may be used to determine (or measure) one or more positional attributes of the semiconductor substrate W in relation to a semiconductor manufacturing process. That is, various positional attribute(s) associated with the semiconductor substrate W, such as for example, a height, a step difference, a change in vertical position, a vertical movement, etc., may be determined using the apparatus 10. For example, the apparatus 10 may be used to determine a height of an upper surface of the substrate stage 30, a height of an upper surface of the semiconductor substrate W, and/or a height of a material layer or element of the semiconductor substrate W. (In this regard, the term "height" denotes a dimension, usually measured in a vertical direction, expressed in relation to an arbitrarily selected reference).

In some embodiments, the apparatus 10 may be used to measure one or more positional attribute(s) associated with the semiconductor substrate W using a Moire effect or in relation to detected Moire pattern(s) (hereafter generally, the "Moire phenomenon"). As will be appreciated by those skilled in the art, the Moire phenomenon is a visual perception of a distinctly different third pattern caused by inexact superimposition of two or more similar patterns.

In various applications related to one or more semiconductor manufacturing process(es), the apparatus 10 may be disposed in (or proximate to) the processing chamber 20. For example, the apparatus 10 may be installed within the processing chamber 20 together with semiconductor manufacturing equipment used to perform the semiconductor manufacturing process(es). In some embodiments, the semiconductor manufacturing process(es) may include a photolithography process. However, embodiments of the inventive concept are limited to only photolithography processes, but may be used during various deposition processes, cleaning processes, etc. Regardless of the particular semiconductor manufacturing process to-be-performed, the apparatus 10 may be provided to determine at least one positional attribute associated with the semiconductor substrate W or the substrate stage 30.

Thus, the light L generated by the light generator 100 of the illumination portion I may be directed by the first optical lens 500 towards the first grating reticle 200. In this regard, a predetermined wavelength of the light L may fall within the ultraviolet (UV) spectrum, the visible light spectrum, the mid-infrared (IR) spectrum, the near-IR spectrum, the far-IR spectrum and/or a terahertz (THz) spectrum.

Referring to FIG. 3A, the first grating reticle 200a, as arranged along the first optical path between the light generator 100 and the semiconductor substrate W, may include first slits 210 characterized by a first pitch P1 and second slits 220 characterized by a second pitch P2 different from the first pitch P1. In some embodiments, the first slits 210 and the second slits 220 may be arranged side-by-side in two columns with in a common plane of the first grating reticle 200a. Here, in some embodiments, the first and second slits 210 and 220 may penetrate through the first grating reticle 200a.

Further in this regard, the first grating reticle 200s may be arranged in the illumination portion I, such that the first and second slits 210 and 220 are substantially orthogonal to the first optical path (i.e., the irradiation direction of the light L generated by the light generator 100). Thus, the first and second slits 210 and 220 may be aligned in a common plane defined by the first grating reticle 200a, such that the light L may simultaneously pass through the first and second slits 210 and 220. Accordingly, the first grating reticle 200a may selectively block a portion of the light L while allowing another portion of the light L to pass through, wherein the portion of the light L passing through the first grating reticle 200a is respectively patterned by the shape and size of the first and second slits 210 and 220. In this regard, for example, each of the first pitch P1 and the second pitch P2 may a range from between about 10 µm to about 200 µm.

Referring to FIG. 3B, the first grating reticle 200b may include first and second slits 210 and 220 that are sequentially arranged one above the other in at least one column.

Referring to FIG. 3C, the first grating reticle 200c may include first slits 210, second slits 220 and fourth slits 230 that are sequentially arranged in at least one column, wherein the fourth slits 230 are characterized by a fourth pitch P4 (e.g., ranging from between about 10 µm to about 200 µm). Hence, a multiplicity of different slits (e.g., first slits 210, second slits 220, and fourth slits 230) may be variously provided in a common plane defined by the first grating reticle 200, such that the light L may simultaneously pass through variously arranged slits.

In some embodiments, at least two of variously arranged slits in a first grating reticle 200 may be characterized by a different shape, a different pitch, a different size, etc.

In some embodiments, the first grating reticle 200 may include electrically actuated (or modulated) slits, instead of fixed slits. Accordingly, such embodiments may further include a modulator (e.g., a Liquid Crystal on Silicon (LCoS), an Acousto-Optic Modulator (AOM), a Grating Light Valve (GLV), or a Digital Micromirror Device (DMD)) capable of selectively actuating, for example, the first slits 210 and the second slits 220. Thus, various slits (e.g., first and second slits 210 and 220) may be variably, temporally and/or spatially provided by the first grating reticle 200 in relation to the first optical path. Here, if the modulator is a LCoS, the apparatus 10 may further include a polarizer functionally provided in relation to the first grating reticle 200, wherein the polarizer may increase contrast of the light L, and may therefore increase a difference in visual characteristics such that the positional attribute of the semiconductor substrate W may be better distinguished from other features.

However the first and second slits 210 and 220 are geometrically defined (e.g., sized, shaped and/or spaced apart) and arranged (e.g., in parallel or in sequence) in relation to the first grating reticle 200, portions of the light L respectively passing through the first and second slits 210 and 220 will thereafter exhibit different characteristics (e.g., a temporal delay, a phase, a color shift, etc.). That is, a first portion of the light L passing through the first slits 210 will exhibit a first characteristic, and a second portion of the light L passing through the second slits 220 will exhibit a second characteristic different from the first characteristic.

After passing through the first grating reticle 200, the light L (including all constituent portions of the light L) may be directed (e.g., focused) by the second optical lens 510 onto a target (e.g., an inspection) region 'A' of the semiconductor substrate W in order to determine a positional attribute of the semiconductor substrate W.

Light reflected from the target region A of the semiconductor substrate W (hereafter, referred to as "reflected light RL", while recognizing that the reflected light is the light L generated by the light generator 100, albeit after being redirected along a different optical path) may be directed (e.g., collimated) along the second optical path by the third optical lens 520 through the second grating reticle 300 and towards the optical detector 400. After passing through the second grating reticle 300, the reflected light RL may be focused on the optical detector 400 by the fourth optical lens 530.

Although the second grating reticle 300 is arranged along the second optical path between the semiconductor substrate W and the optical detector 400 in the illustrated example of FIG. 1, this need not always be the case and the disposition of the first grating reticle 200 and disposition of the second grating reticle 300 are deemed to be matters of design choice within various embodiments of the inventive concept.

Referring to FIG. 4, the second grating reticle 300 may include third slits 310 characterized by a third pitch P3. Here, the second grating reticle 300 may be arranged in the receiving portion R of the apparatus 10 within chamber 20, such that the third slits 310 are disposed to be substantially orthogonal to the second optical path (i.e., the irradiation direction of the reflected light RL from the semiconductor substrate W towards the optical detector 400).

The third pitch P3 of the third slits 310 may be different from the first pitch P1 of the first slits 210 and/or the second pitch P2 of the second slits 220. The second grating reticle 300 may selectively block a portion of the reflected light RL, while passing another portion of the reflected light RL. In some embodiments, the third pitch P3 may range from between about 10 μm to about 200 μm.

Referring again to FIG. 3A, the first slits 210 and the second slits 220 may be arranged side-by-side (i.e., in parallel) on the first grating reticle 200a in a common optical plane. Accordingly, the optical detector 400 may be used to respectively capture first lines associated with the first portion of the light L/reflected light RL sequentially passing through the first slits 210 and the third slits 310, and second lines associated with the second portion of the light L/reflected light RL sequentially passing through the second slits 220 and the third slits 310. (In this context, the term "light L/reflected light RL" denotes a relationship in which a portion of the light L passes through a one grating reticle to provide refracted light, which is then reflected from a surface of the semiconductor substrate as reflected light, which then passes through another grating reticle).

Referring again to FIG. 3B, the first slits 210 and the second slits 220 may be arranged one over the other (i.e. sequentially) on the first grating reticle 200b in a common optical plane. Accordingly, the optical detector 400 may be used to capture first lines associated with the first portion of the light L/reflected light RL sequentially passing through the first slits 210 and the third slits 310, and second lines associated with the second portion of the light L/reflected light RL sequentially passing through the second sits 220 and the third slits 310.

Referring again to FIG. 3C, the first slits 210, the second slits 220 and the fourth slits 230 may be variously arranged on the first grating reticle 200c in a common optical plane. Accordingly, the optical detector 400 may be used to continuously capture corresponding lines associated with respective portions of the light L/reflected light RL passing through some combination of first slits 210, second slits 220, fourth slits 230 and third slits 310.

Hence, the reflected light RL passing from the second grating reticle 300 may include a first pattern corresponding to the first portion of the light L/reflected light RL passing through first and third slits 210 and 310, a second pattern corresponding to the second portion of the light L/reflected light RL passing through the second and third slits 220 and 310, and/or a third pattern corresponding to a third portion of the light L/reflected light RL passing through the fourth and third slits 230 and 310. In this regard, the first pattern may result from the Moire phenomenon between lines associated with the first and third slits 210 and 310, the second pattern may result from the Moire phenomenon between the second and third slits 220 and 310, and the third pattern may result from the Moire phenomenon between lines associated with the fourth and third slits 230 and 310.

Accordingly, in some embodiments wherein the optical detector 400 is a line camera, N patterns (where 'N' is a positive integer) resulting from respective portions of light L/reflected light RL passing through various arrangements of slits may be continuously captured (e.g., imaged) as corresponding pixels. That is, the line camera 400 may capture a $1^{st}$ set of pixels associated with the $1^{st}$ pattern, a $2^{nd}$ set of pixels associated with the $2^{nd}$ pattern, and ... an Nth set of pixels associated with an Nth pattern.

The optical detector 400 may be further configured to measure (e.g., calculate) a positional attribute associated with the semiconductor substrate W in relation to two or more patterns. For example, the optical detector 400 may measure a relative height of the semiconductor substrate W using the two or more patterns. (Here, in some embodiments, the term "relative height" denotes a vertical position of the semiconductor substrate W in relation to a reference position.

Referring to FIG. 2, the optical detector 400 is able to accurately measure the positional attribute of the semiconductor substrate W in relation to two or more patterns because light L reflected from the semiconductor substrate W (reflected light RL) varies in accordance with, for example, a relative height H of an upper surface of the semiconductor substrate W. That is, if the semiconductor substrate W1 is disposed at a first height H1 (e.g., a reference height), the light L illuminating the target region A of the semiconductor substrate W will be reflected (as first reflected light RL1) towards the optical detector 400 primarily along one reflected optical path. However, if the semiconductor substrate W2 is disposed at a second height H2 (e.g., higher than H1), the light L illuminating the target region A of the semiconductor substrate W will be reflected (as second reflected light RL2) towards the optical detector 400 primarily another reflected optical path different from the one reflected optical path.

In some embodiments, the optical detector 400 may be used to determine (or measure) a positional attribute (e.g., a height) of the semiconductor substrate W in relation to the first and second reflected light RL1 and RL2 using a triangulation approach. That is, the optical detector 400 may calculate the height 'H' of the semiconductor substrate W in relation to the first and second reflected lights RL1 and RL2 using Equations (1), (2) and (3) that follow:

$$Z = \frac{Y}{2\sin(\theta)} \qquad \text{Equation (1)}$$

$$\text{SIN}(180 - 2\theta) = \text{SIN}(2\theta) = 2\text{SIN}(\theta)\text{COS}(\theta) = \frac{Y}{A} \qquad \text{Equation (2)}$$

$$\text{COS}(\theta) = \frac{Z}{A}, \qquad \text{Equation (3)}$$

wherein 'θ' is an incident angle of the light L, 'Z' is a height difference of the semiconductor substrate, and 'Y' is a distance difference between primary propagation paths for the first and second reflected light RL1 and RL2.

Using this exemplary approach, the optical detector 400 may calculate a step difference associated with a fine, uneven structure formed on the upper surface of the semiconductor substrate W.

Further, the optical detector 400 may adjust (e.g., enlarge) a useful recognition area used to recognize the positional attribute of the semiconductor substrate W in relation to first and second pixels. That is, the optical detector 400 may enlarge the recognition area by comparing a first peak pixel having a highest intensity among the first pixels with a second peak pixel having a highest intensity among the second pixels.

Since the first grating reticle 200 includes first and second slits 210 and 220 having different, respective first and second pitches P1 and P2, the apparatus 10 may obtain first and second patterns respectively generated by the Moire phenomenon in relation to light L/reflected light RL sequentially passing through the first and second grating reticles 200 and 300. That is, the first pattern may be obtained in relation to a first portion of light L/reflected light RL sequentially passing through the first and third slits 210 and 310, and the second pattern may be obtained in relation to a second portion of light L/reflected light RL sequentially passing through the second and third slits 220 and 310. The apparatus 10 monitoring semiconductor manufacturing equipment may also increase the recognition area using selected pixels from pixels associated with each of the first and second patterns. In this manner, the apparatus 10 may accurately determine a positional attribute associated with a semiconductor substrate without repetitious and time-consuming processing steps.

Figure 5:
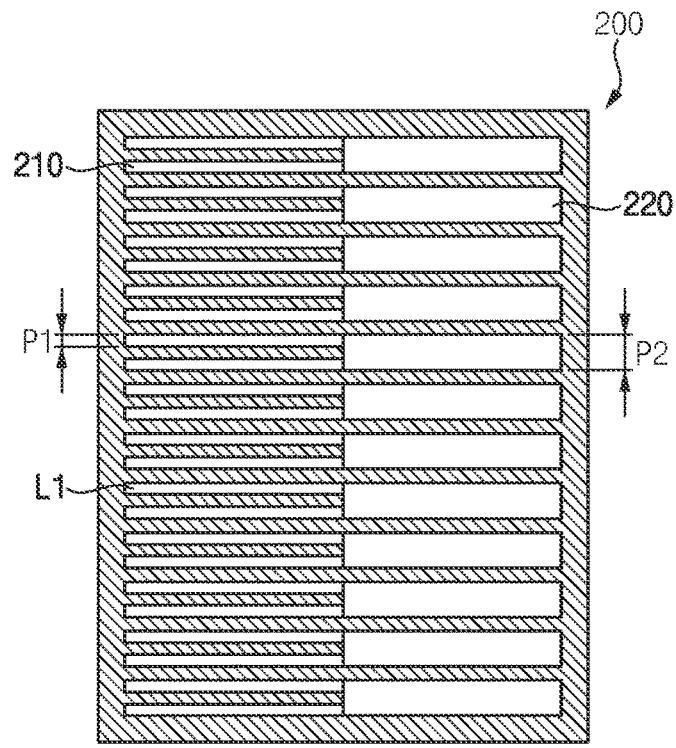
FIGS. 5, 6, 7, 8, and 9 (hereafter collectively, "FIGS. 5 to 9") are related diagrams illustrating an optical measurement method for semiconductor manufacturing equipment according to embodiments of the inventive concept.
Figure 6:
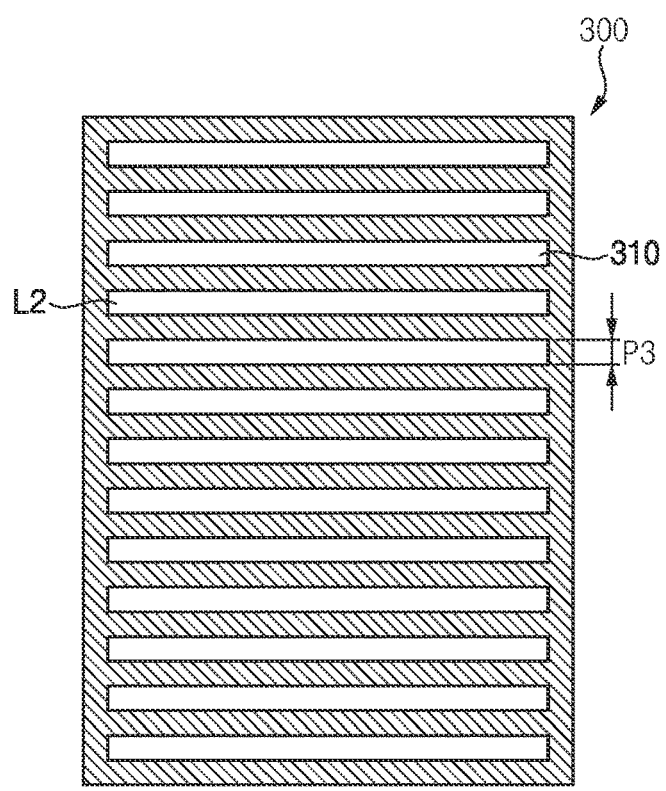
Figure 7:
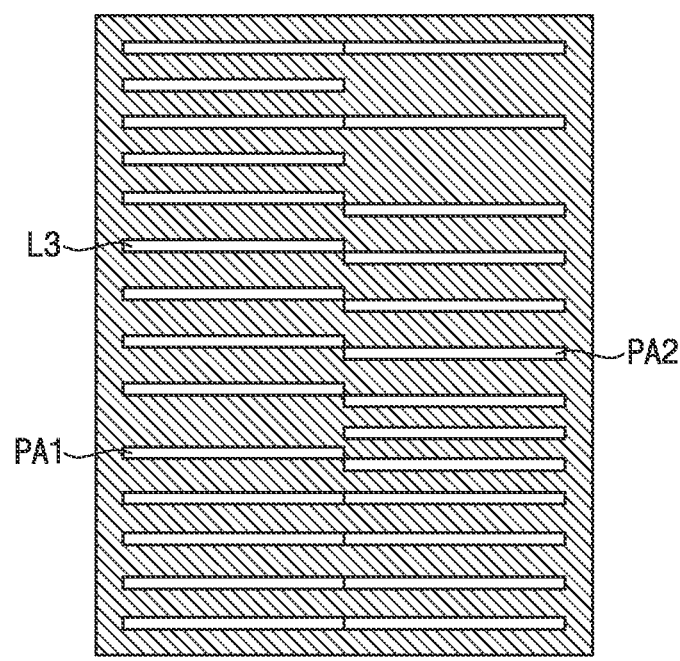
Figure 8:
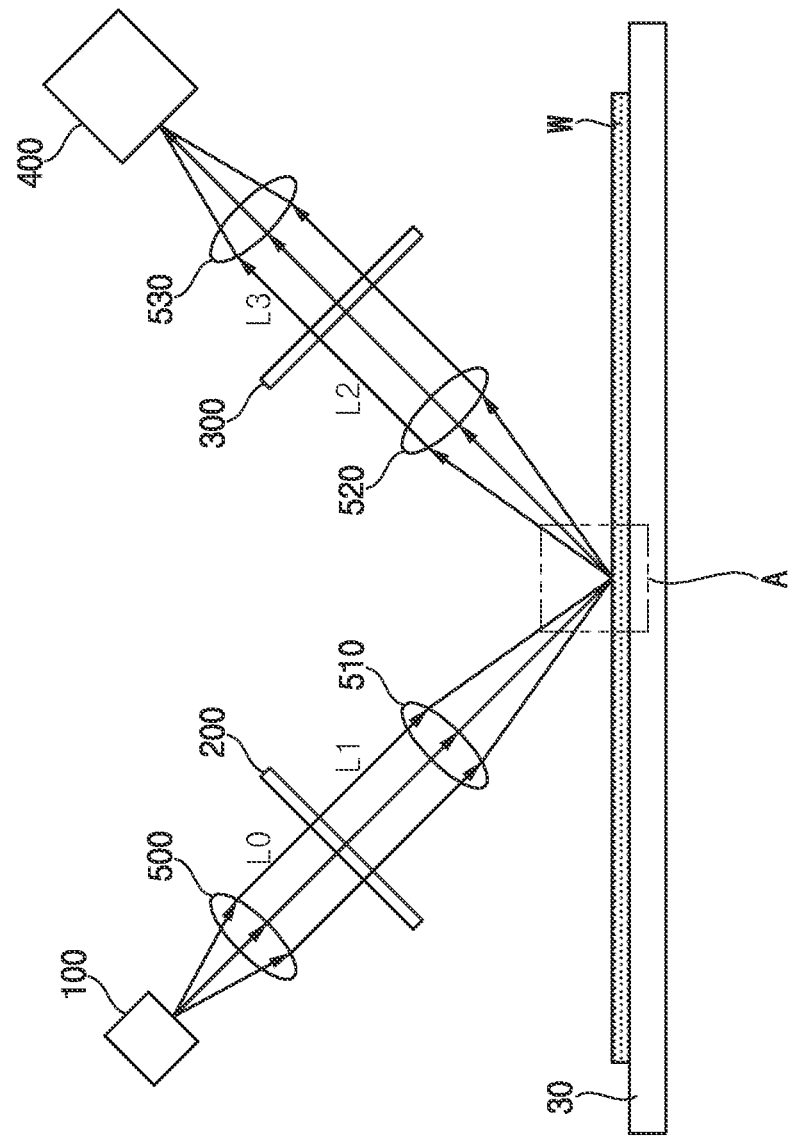
Figure 9:
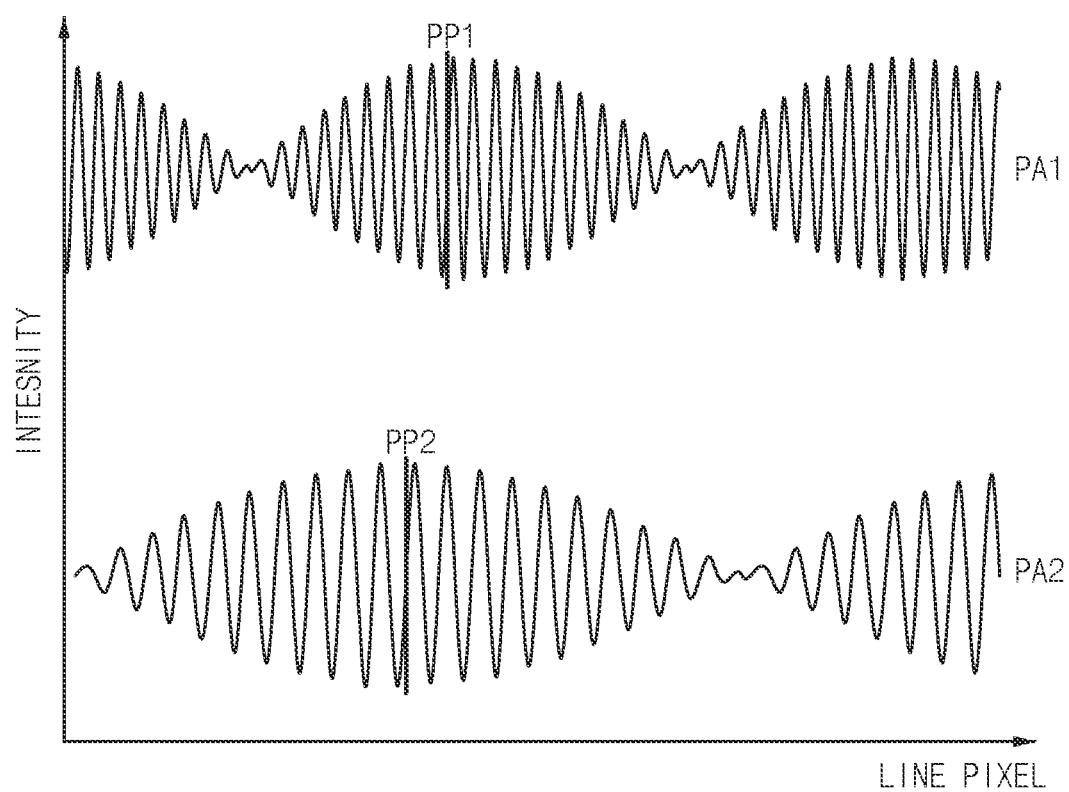

Hereinafter, an optical measurement method using the apparatus 10 monitoring semiconductor manufacturing equipment of FIG. 1 will be described in relation to FIGS. 5 to 9, wherein FIGS. 5, 6, and 7 are respective plan views illustrating various grating reticles; FIG. 8 is a conceptual diagram analogous to that of FIG. 1; and FIG. 9 is a conceptual diagram illustrating exemplary first and second patterns.

Referring to FIGS. 5 and 8, light L0 generated by the light generator 100 is irradiated onto the first grating reticle 200. In some embodiments, the light L0 may collimated and directed towards the first grating reticle 200 by the first optical lens 500. Here, the light L0 may irradiate the first grating reticle 200 in a direction substantially orthogonal to the first optical path between the light generator 100 and the semiconductor substrate W. After passing through the first grating reticle 200, the light L0 becomes first refracted light L1.

The first refracted light L1 passing through the first grating reticle 200 may be focused onto the target region A of the semiconductor substrate W. The first grating reticle 200 may include the first slits 210 having the first pitch P1 and the second slits 220 having the second pitch P2, different from the first pitch P1, wherein each of the first pitch P1 and the second pitch P2 may range from between about 10 μm to about 200 μm.

At least a portion of the light L0 may be blocked by the first grating reticle 200 while another portion of the light L0 is allowed to pass through the first grating reticle 200. The resulting first refracted light L1 passing from the first grating reticle 200 may include the first initial pattern corresponding to the first portion of the light L0 passing through the first slits 210 and a second initial pattern corresponding to the second portion of the light L0 passing through the second slits 220.

In some embodiments, the first and second slits 210 and 220 may be alternately provided (e.g., exposed) in a common optical plane defined by the first grating reticle 200 using a modulator (e.g., a LCoS, an AOM, a GLV, or a DMD).

Thus, the light L0 generated by the light generator 100 may simultaneously irradiate the first and second slits 210 and 220. Alternately, the first and second slits 210 and 220 of the first grating reticle 200 respectively displayed at different times. Using either approach, the light L0 generated by the light generator 100 may uniformly irradiate the first grating reticle 200, such that the first and second slits 210 and 220 variously expose portions of the light L0 at different times on the first grating reticle 200. For example, the first grating reticle 200 may expose the first slits 210 to the initial light L0 at a first time (e.g., a first time period), and expose the second slits 220 to the initial light L0 at a second time (e.g., a second time period) different from the first time.

In some embodiments, the first refracted light L1 passing from the first grating reticle 200 may be focused on the target region A of the semiconductor substrate W using the second optical lens 510. Here, the target region A may be selected in relation to a particular positional attribute (e.g., a height) of the semiconductor substrate W.

Referring to FIGS. 6, 7 and 8, the first refracted light L1 is reflected from the target region A of the semiconductor substrate W, as reflected light L2, and directed to the optical detector 400 along the second optical path. In this regard, the reflected light L2 may be collimated and/or directed through the second grating reticle 300 using the third optical lens 520. Upon passing through the second grating reticle 300, the reflected light L2 becomes second refracted light L3.

Referring to FIG. 6, the reflected light L2 from the semiconductor substrate W may irradiate the third slits 310 of the second grating reticle 300 having a third pitch P3 (e.g., ranging from between about of 10 μm to about 200 μm) different from the first pitch P1 and the second pitch P2. The resulting second refracted light L3 passing from the second grating reticle 300 may include a third pattern associated with the reflected light L2 passing through the third slits 310. That is, at least a portion of the reflected light L2 is blocked by the second grating reticle 300, while another portion of the reflected light L2 is allowed to passed through the second grating reticle 300.

Referring to FIG. 7, the second refracted light L3 passing from the second grating reticle 300 may include a first pattern PA1 (generated by the Moire phenomenon) corresponding to a first portion of the first refracted light L1/reflected light L2 sequentially passing through the first and third slits 210 and 310, and a second pattern PA2 (generated by the Moire phenomenon) corresponding to a second portion of the first refracted light L1/reflected light L2 sequentially passing through the second and third slits 220 and 310.

Referring to FIGS. 8 and 9, the second refracted light L3 passing from the second grating reticle 300 may be focused on the optical detector 400 using the fourth optical lens 530. And the optical detector 400 may determine the positional attribute (e.g., height) associated with the semiconductor substrate W (or the substrate stage 30) in relation to second refracted light L3 passes from the second grating reticle 300.

That is, in some embodiments, the first pattern PA1 may be obtained in relation to the first refracted light L1/reflected light L2 sequentially passing through the first and third slits 210 and 310, and the second pattern PA2 may be obtained in relation to first refracted light L1/reflected light L2 sequentially passing through the second and third slits 220 and 310. Thereafter, the desired positional attribute associated with the semiconductor substrate W may be determined in relation to the first and second patterns PA1 and PA2. For example, a height associated with the semiconductor substrate W may be accurately determined by simultaneously analyzing the first and second patterns PA1 and PA2. In this regard, a triangulation approach may be used in relation to the first and second patterns PA1 and PA2 to determine the height of the semiconductor substrate W.

Additionally or alternatively, the second refracted light L3 passing from the second grating reticle 300 may be captured (e.g., imaged) by the optical detector 400 (e.g., a line camera) as line pixels having different intensities. Hence, the first pattern PA1 may include a first peak pixel PP1 having a highest intensity among pixels associated with the first pattern PA1, and the second pattern PA2 may include a second peak pixel PP2 having a highest intensity among pixels associated with the second pattern PA2.

Referring to FIGS. 8 and 9, the optical detector 400 may display some or all of the line pixels corresponding to each of the first and second patterns PA1 and PA2, and may particularly display certain pixels according to their relative intensity.

Thus, within the apparatus 10 of FIGS. 1 and 8, the optical detector 400 may be used to capture the second refracted light L3 resulting from light reflected from the target region A of the semiconductor substrate W which includes a positional attribute (e.g., height) to-be-measured. That is, the optical detector 400 may measure the positional attribute, for example, by comparing the first peak pixel PP1 with the second peak pixel PP2.

When compared to conventional approaches using only a single peak pixel value, the positional attribute measurement approach provided by embodiments of the inventive concept is notably more efficient since it simultaneously uses at least first and second peak pixels PP1 and PP2. Further, a measurement range associated with the positional attribute may be expanded by using the first peak pixel PP1 and the second peak pixel PP2.

Consistent with embodiments of the inventive concept, the first peak pixel PP1 of the first pattern PA1 and the second peak pixel PP2 of the second pattern PA2 may be obtained without the need of repetitious pattern detection. Further, a range of positional attributes associated with the semiconductor substrate W and measured using a relationship between the first and second peak pixels PP1 and PP2 may be expanded. Still further, the optical detector 400 may simultaneously analyze the first and second patterns PA1 and PA2 to enlarge the positional attribute recognition region, rather than analyzing only a single pattern.

The foregoing embodiments are illustrative in nature. Although a few embodiments have been described, those skilled in the art will readily appreciate that many modifications to same are possible without materially departing from the scope of the inventive concept, as defined by the following claims.

What is claimed is:

1. An apparatus monitoring semiconductor manufacturing equipment, the apparatus comprising:
   an optical detector;
   a light generator configured to generate light along a first optical path towards a semiconductor substrate disposed on a substrate stage in a processing chamber, wherein upon irradiating the semiconductor substrate, the light becomes reflected light along a second optical path away from the semiconductor substrate and towards the optical detector;
   a first grating reticle disposed between the light generator and the semiconductor substrate, wherein the first grating reticle includes first slits having a first pitch and second slits having a second pitch different from the first pitch; and
   a second grating reticle disposed between the semiconductor substrate and the optical detector, wherein the second grating reticle includes third slits having a third pitch different from the first pitch and the second pitch,
   wherein the optical detector is configured to determine a positional attribute of the semiconductor substrate in relation to a first pattern and a second pattern,
   wherein the first pattern corresponds to a first portion of light/reflected light sequentially passing through the first slits and the third slits,
   wherein the second pattern corresponds to a second portion of light/reflected light sequentially passing through the second slits and the third slits, and
   wherein the first portion of the light passing through the first slits of the first grating reticle and the second portion of the light passing through the second slits of the first grating reticle are directed onto a same target region of the semiconductor substrate along the first optical path by a first optical lens,
   wherein light reflected from the same target region of the semiconductor substrate is directed along the second optical path by a second optical lens through the second grating reticle and towards the optical detector,
   wherein the first grating reticle further includes fourth slits having a fourth pitch different from the first pitch, the second pitch, and the third pitch, and
   wherein the optical detector is configured to determine the positional attribute of the semiconductor substrate in relation to a third pattern corresponding to a third portion of light/reflected light sequentially passing through the fourth slits and the third slits.

2. The apparatus of claim 1, wherein the optical detector is configured to determine the positional attribute of the semiconductor substrate in relation to the first pattern and the second pattern using a triangulation approach.

3. The apparatus of claim 1, wherein each of the first pitch, the second pitch and the third pitch ranges from between about 10 μm to about 200 μm.

4. The apparatus of claim 1, wherein the first slits and the second slits are arranged in parallel on the first grating reticle in a common optical plane.

5. The apparatus of claim 1, wherein the first slits and the second slits are sequentially arranged in at least one column on the first grating reticle and in a common optical plane.

6. The apparatus of claim 1, wherein the optical detector includes a line camera configured to capture first pixels associated with the first pattern and second pixels associated with the second pattern.

7. The apparatus of claim 1,
   wherein the first grating reticle includes a modulator configured to selectively expose the at least one of the first slits and to selectively exposed the at least one of the second slits, and
   wherein the modulator includes at least one of a Liquid Crystal on Silicon (LCoS), an Acousto-Optic Modulator (AOM), a Grating Light Valve (GLV), and a Digital Micromirror Device (DMD).

8. The apparatus of claim 7, wherein the modulator is configured to selectively expose the at least one of the first slits at a first time, and thereafter selectively expose the at least one of the second slits at a second time.

9. The apparatus of claim 1,
   wherein the light generator is configured to generate the light at a predetermined wavelength, and
   wherein the predetermined wavelength is one of an ultraviolet, a visible, an infrared, a near-infrared, a far-infrared, or a terahertz (THz) spectrum.

10. The apparatus of claim 1, wherein the positional attribute is a height.

11. An apparatus monitoring semiconductor manufacturing equipment in relation to processing of a semiconductor substrate, the apparatus comprising:
    an optical detector;
    a light generator configured to generate light along a first optical path towards the semiconductor substrate disposed on a substrate stage in a processing chamber, wherein upon irradiating the semiconductor substrate, the light becomes reflected light along a second optical path away from the semiconductor substrate and towards the optical detector;
    a first grating reticle disposed between the light generator and the semiconductor substrate, wherein the first grating reticle includes first slits having a first pitch and second slits having a second pitch different from the first pitch; and a second grating reticle disposed between the semiconductor substrate and the optical detector, wherein the second grating reticle includes third slits having a third pitch different from the first pitch and the second pitch, wherein the optical detector is configured to determine a height of the semiconductor substrate in relation to a first pattern and a second pattern using a triangulation approach, wherein the first pattern corresponds to a first portion of light/reflected light sequentially passing through the first slits and the third slits, wherein the second pattern corresponds to a second portion of light/reflected light sequentially passing through the second slits and the third slits, wherein the first portion of the light passing through the first slits of the first grating reticle and the second portion of the light passing through the second slits of the first grating reticle are directed onto a same target region of the semiconductor substrate along the first optical path by a first optical lens, wherein light reflected from the same target region of the semiconductor substrate is directed along the second optical path by a second optical lens through the second grating reticle and towards the optical detector, wherein the first grating reticle includes fourth slits having a fourth pitch different from the first pitch, the second pitch, and the third pitch, and wherein the optical detector is configured to determine a positional attribute of the semiconductor substrate in relation to a third pattern corresponding to a third portion of light/reflected light sequentially passing through the fourth slits and the third slits.

12. The apparatus of claim 11, wherein the first slits and the second slits are arranged in parallel on the first grating reticle in a common optical plane.

13. The apparatus of claim 11, wherein the first slits and the second slits are sequentially arranged in at least one column on the first grating reticle and in a common optical plane.

14. The apparatus of claim 11, wherein the optical detector includes a line camera configured to capture capturing first pixels associated with the first pattern and second pixels associated with the second pattern.

15. The apparatus of claim 11,
wherein the first grating reticle includes a modulator configured to selectively expose the at least one of the first slits and selectively expose the at least one of the second slits, and wherein the modulator includes at least one of a Liquid Crystal on Silicon (LCoS), an Acousto-Optic Modulator (AOM), a Grating Light Valve (GLV), and a Digital Micromirror Device (DMD).

16. The apparatus of claim 15, wherein the modulator is configured to selectively expose the at least one of the first slits at a first time, and thereafter selectively expose the at least one of the second slits at a second time.

17. The apparatus of claim 11,
wherein the light generator is configured to generate the light at a predetermined wavelength, and wherein the predetermined wavelength is one of an ultraviolet, a visible, an infrared, a near-infrared, a far-infrared, or a terahertz (THz) spectrum.

18. An apparatus monitoring semiconductor manufacturing equipment in relation to processing of a semiconductor substrate, the apparatus comprising:

a light generator configured to generate light having a predetermined wavelength along a first optical path between the light generator and the semiconductor substrate;

a first optical lens configured to direct the light along the first optical path;

a first grating reticle disposed along the first optical path, including first slits having a first pitch and second slits having a second pitch different from the first pitch, and configured to selectively passing the light to generate first refracted light;

a second optical lens configured to focus the first refracted light onto the semiconductor substrate, wherein, upon irradiating the semiconductor substrate, the first refracted light becomes reflected light along a second optical path different from the first optical path;

a third optical lens configured to direct the reflected light along the second optical path;

a second grating reticle disposed along the second optical path, including third slits having a third pitch different from the first pitch and the second pitch, and configured to selectively pass the reflected light to generate second refracted light; and an optical detector configured to determine a height associated with the semiconductor substrate using a triangulation approach in relation to a first pattern and a second pattern, wherein the first pattern corresponds to a first portion of light/reflected light sequentially passing through the first slits and the third slits, wherein the second pattern corresponds to a second portion of light/reflected light sequentially passing through the second slits and the third slits, wherein the first portion of the light passing through the first slits of the first grating reticle and the second portion of the light passing through the second slits of the first grating reticle are directed onto a same target region of the semiconductor substrate along the first optical path by the first optical lens, and wherein light reflected from the same target region of the semiconductor substrate is directed along the second optical path by the third optical lens through the second grating reticle and towards the optical detector, wherein the first grating reticle includes fourth slits having a fourth pitch different from the first pitch, the second pitch, and the third pitch, and wherein the optical detector is configured to determine a positional attribute of the semiconductor substrate in relation to a third pattern corresponding to a third portion of light/reflected light sequentially passing through the fourth slits and the third slits.

* * * * *